(12) United States Patent
Coolbaugh et al.

(10) Patent No.: US 6,992,344 B2
(45) Date of Patent: Jan. 31, 2006

(54) DAMASCENE INTEGRATION SCHEME FOR DEVELOPING METAL-INSULATOR-METAL CAPACITORS

(75) Inventors: Douglas D. Coolbaugh, Essex Junction, VT (US); John M. Cotte, New Fairfield, CT (US); Ebenezer E. Eshun, Essex Junction, VT (US); Kenneth J. Stein, Sandy Hook, CT (US); Kunal Vaed, Poughkeepsie, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/319,724

(22) Filed: Dec. 13, 2002

(65) Prior Publication Data

US 2004/0113235 A1 Jun. 17, 2004

(51) Int. Cl.
*H01L 27/108* (2006.01)

(52) U.S. Cl. ............... 257/301; 257/303; 257/304; 257/306; 257/310; 257/324; 257/397; 257/532

(58) Field of Classification Search ............... 257/301, 257/303, 304, 306, 310, 324, 397, 532, 307, 257/535
See application file for complete search history.

(56) References Cited

U.S. PATENT DOCUMENTS

| | | | |
|---|---|---|---|
| 6,075,691 A | 6/2000 | Duenas et al. | |
| 6,320,244 B1 | 11/2001 | Alers et al. | |
| 6,323,084 B1 * | 11/2001 | Hyun et al. | 438/255 |
| 6,329,234 B1 | 12/2001 | Ma et al. | |
| 6,341,056 B1 | 1/2002 | Allman et al. | |
| 6,344,413 B1 | 2/2002 | Zurcher et al. | |
| 6,373,087 B1 * | 4/2002 | Harris et al. | 257/301 |
| 2002/0176989 A1 | 11/2002 | Knudsen et al. | |
| 2003/0139017 A1 * | 7/2003 | Park | 438/396 |

FOREIGN PATENT DOCUMENTS

| | | |
|---|---|---|
| TW | 451469 | 8/2001 |
| TW | 507313 | 10/2002 |

* cited by examiner

*Primary Examiner*—Minhloan Tran
*Assistant Examiner*—Tan Tran
(74) *Attorney, Agent, or Firm*—DeLio & Peterson, LLC

(57) ABSTRACT

The invention is directed to unique high-surface area BEOL capacitor structures with high-k dielectric layers and methods for fabricating the same. These high-surface area BEOL capacitor structures may be used in analog and mixed signal applications. The capacitor is formed within a trench with pedestals within the trench to provide additional surface area. The top and bottom electrodes are created using damascene integration scheme. The dielectric layer is created as a multilayer dielectric film comprising for instance $Al_2O_3$, $Al_2O_3/Ta_2O_5$, $Al_2O_3/Ta_2O_5/Al_2O_3$ and the like. The dielectric layer may be deposited by methods like atomic layer deposition or chemical vapor deposition. The dielectric layer used in the capacitor may also be produced by anodic oxidation of a metallic precursor to yield a high dielectric constant oxide layer.

14 Claims, 18 Drawing Sheets

DAMASCENE INTEGRATION SCHEME FOR DEVELOPING METAL-INSULATOR-METAL CAPACITORS

BACKGROUND OF THE INVENTION

1. Field of the Invention

The present invention relates to semiconductor devices, and in particular, to a capacitor and method of fabricating such capacitor by a damascene process using a pedestal within a trench to increase the surface area of the resultant capacitor.

2. Description of Related Art

In semiconductor fabrication processes, layers of insulating, conducting and semiconducting materials are commonly deposited and patterned to form integrated circuits (IC). Contact vias, i.e., openings, are also commonly formed in insulating materials known as interlevel dielectrics (ILDs). These vias may then be filled with conductive material to interconnect electrical devices and wiring at various levels.

Damascene processing similarly involves etching trenches in insulating layers in a desired pattern for a wiring layer. These trenches are then filled with conductive material to fill the damascene regions thereby producing integrated wires within the damascene regions. Further, in those ICs where contact vias also extend downwardly from the bottom of the trenches, the downwardly extending vias may be simultaneously filled with conductive material. This process is known as dual damascene processing of the IC.

Recent semiconductor device manufacturing technology uses copper (Cu) as a wiring material in semiconductor devices having small feature sizes because copper has low resistivity and high resistance to electro-migration. However, copper's complicated chemical reactions makes copper difficult to pattern and use for metal wiring. For example, copper wiring patterns are easily oxidized when exposed to air. Such oxidation increases the resistance of the wiring pattern. Thus, to prevent oxidation, damascene wiring is frequently used for copper interconnection technology in which trenches are formed in an insulating layer and filled with copper to form conductive lines. Chemical mechanical polishing, or an etch-back process, then planarizes the conductive layer to expose the insulative layer. As a result, a damascene metal wiring pattern remains in the damascene regions.

In these conventional damascene and dual damascene processing techniques, only lateral and/or sidewall areas of the metal wiring patterns in such damascene regions contribute to the areal capacitance of a resultant capacitor formed using such patterns. For instance, U.S. Pat. No. 6,320,244 entitled "Integrated circuit device having dual damascene capacitor" discloses multi-component high-k dielectric films along with a damascene fabricated top electrode whereby only sidewalls of the damascene metal wiring area is used to increase the areal capacitance of the capacitor. U.S. Pat. No. 6,075,691 entitled "Thin film capacitors and process for making them" discloses using the lateral area to increase the areal capacitance of the capacitor.

However, as semiconductor devices continue to decrease in size, increased surface areas within the damascene regions will be needed to provide these modern semiconductors with required high capacitance. Accordingly, a need continues to exist in the art for providing convenient damascene processing techniques to enable improved high-k dielectric capacitors.

SUMMARY OF THE INVENTION

Bearing in mind the problems and deficiencies of the prior art, it is therefore an object of the present invention to provide a uniquely modified damascene process for fabricating high-k dielectric capacitors.

It is another object of the present invention to provide a method of making and a capacitor having increased surface area, and hence, improved capacitance.

A further object of the invention is to provide a method of making and a capacitor dielectric with high permitivity combined with low leakage current, high breakdown voltage and good reliability.

Another object of the invention is to provide a method of making and a capacitor that yields high capacitance and hence saves overall chip area.

Yet another object of the invention is to provide a method of making and a damascene capacitor that avoids shorting between the top and bottom electrodes.

Still another object of the invention is to provide a method of making and a capacitor whose structure is planar, allowing standard via contact processes to be used.

It is yet another object of the present invention to provide a method of making and a capacitor that may be used for a variety of analog and mixed signal applications including, for example, amplifiers, filters, A/D converters and resonators.

The above and other objects and advantages, which will be apparent to one of skill in the art, are achieved in the present invention, which, is directed to a capacitor structure having significantly increased areal capacitance and methods for making the same. The capacitor structure may be formed by providing an inter-level dielectric on a semiconductor substrate, etching a trench in said inter-level dielectric stopping at underlying barrier layers, depositing a conductive material (i.e. copper) within said trench and forming a conductive pedestal within said trench. The pedestal increases surface area of the capacitor. The pedestal formation may or may not be followed by the removal of the barrier layers. High-k dielectric layers may be formed by creating a triple layer dielectric stack in which the top and bottom layers are dielectric leakage barriers, such as $Al_2O_3$, and the middle layer may be a high-dielectric constant layer, such as $Ta_2O_5$. The top and bottom layers may be deposited by atomic layer deposition to low thicknesses to achieve high capacitance. The high-k dielectric layers may also be formed by anodizing metal precursor films (i.e., conversion of Ta or TaN to produce $Ta_2O_5$). The top electrode may be formed by depositing a barrier and a seed layer within the trench/pedestal area, electro-depositing conductive metal (i.e. copper), planarizing conductive metal layer, barrier layer, high-k dielectric, and stopping on inter-level dielectric layer. Alternatively, the top electrode planarization may stop at the barrier layer previously not removed.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2B' illustrates an alternate embodiment of the invention wherein no barrier layer is deposited over the structure of FIG. 2A.

FIG. 3A' illustrates a side view of the step of etching a window through the cap layer and stopping at the underlying conductive electro-deposited layer.

FIG. 4A' illustrates a side view of electroless deposition of a conductive pedestal within the window of FIG. 3A' to form the bottom electrode whereby portions of the cap layer have been selectively removed.

FIG. 5F' illustrates a side view of the process steps of forming a metal-insulator-metal capacitor comprising single layer high-k dielectric material using the structure of FIG. 4A'.

FIG. 6F' illustrates a side view of the process steps of forming a metal-insulator-metal capacitor comprising a trilayer high-k dielectric material using the structure of FIG. 4A'.

DESCRIPTION OF THE PREFERRED EMBODIMENT(S)

Figure 1A:
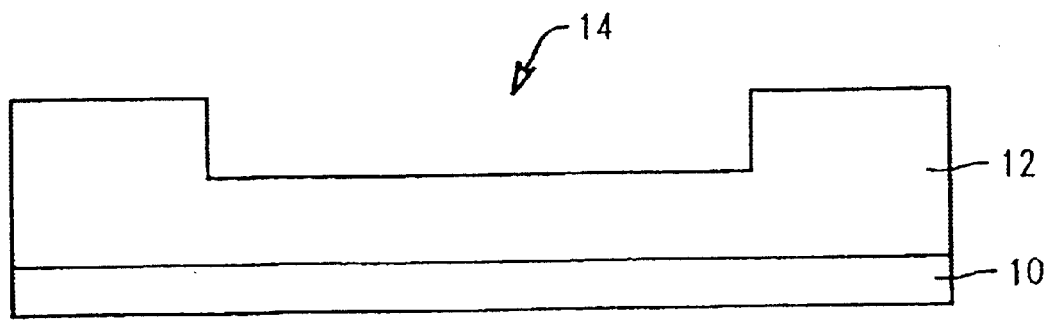
FIG. 1A illustrates a side view of the initial step of forming a single damascene metal interconnect level on a substrate by etching an opening in an overlying inter-level dielectric layer.

In describing the preferred embodiment of the present invention, reference will be made herein to FIGS. 1A–7D of the drawings in which like numerals refer to like features of the invention. Features of the invention are not necessarily shown to scale in the drawings.

The instant invention discloses a two lithographic mask method for developing high-k dielectric capacitors using a uniquely modified damascene process that forms conductive pedestals within a trench to increase the surface area of the resultant capacitor. The two masks employed to build the capacitor are required for patterning the trench and the pedestals within the trench. The resultant structure realizes a high-k dielectric capacitor with top and bottom metal electrodes, both preferably comprising low resistivity copper. The use of metal electrodes yields higher voltage linearity over a large voltage range, and improved quality-factors as compared with MOS capacitors. The use of copper plates results in lower RC delay and better electro-migration resistance.

The capacitor has increased surface area due to the conductive pedestal being formed within the trench. The increased surface area due to the pedestal within the trench advantageously enables the capacitor to have high capacitance C, as described by the following formula:

$$C = \epsilon_0 \epsilon_r d/A,$$

wherein, $\epsilon_0$ is the permitivity of the free space, $\epsilon_0 = 8.85 \times .10^{-14}$ F/cm, $\epsilon_r$ is the relative permitivity (also referred to as the dielectric constant or "k"), A is the surface area of the plate and d is the thickness of dielectric layer.

In a preferred embodiment of the invention, the bottom electrode pedestal may increase the surface area of the capacitor to the order of at least 40%, or more, as compared to a structure not having pedestals. The integration scheme also avoids shorting between top and bottom electrodes of the resultant capacitor, as well as avoids additional steps of creating topography on the substrate for forming via contacts within the capacitor.

The instant invention will be better understood in accordance with the description of the invention as described below with reference to FIGS. 1A–7D.

FIG. 1A illustrates the initial steps of forming a single damascene metal interconnect level on a substrate. As shown, first an inter-level dielectric (ILD) layer 12 is provided over a substrate layer 10. The ILD layer 12 may include a material such as $SiO_2$, $Si_3N_4$, fluorinated silicon glass (FSG), phosphosilicate glass (PSG), low-k dielectrics like SiLK, carbon doped oxides and the like, while the substrate layer 10 may include a material such as silicon, $Si_3N_4$, or an etch-stop layer above an underlying Cu/Al interconnect level. The ILD layer may be deposited by known techniques including chemical vapor deposition (CVD) processes, sputtering or spin-on processes for organics. After the ILD layer 12 is formed over the substrate 10, a first trench opening 14 is formed in the ILD layer 12 by patterning the ILD layer using a mask over the ILD layer 12, followed by etching exposed portions of ILD layer 12. The opening 14 may be formed to depths ranging from about 0.1 μm to about 7.0 μm and to x, y dimensions ranging from about 5 μm to about 400 μm, preferably to dimensions of about 12 μm by 50 μm.

Subsequently, a barrier layer comprising a liner/seed layer 16 may be formed within the opening 14 to conformally coat all sidewalls within opening 14. Liner 16 may include tantalum, tantalum nitride or combinations thereof as known in the art, while the seed layer may comprise a layer that initiates plating such as, for example, copper, nickel and the like. The liner/seed layer 16 may be deposited by known techniques including, but not limited to, sputtering to a thickness ranging from about 100 A to about 5000 A.

Figure 1B:
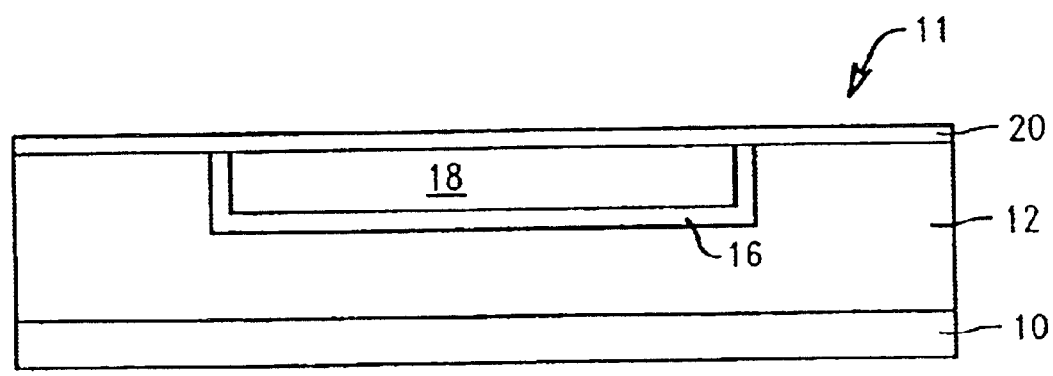
FIG. 1B illustrates a side view of the step of depositing liner and a conductive seed layer in the opening of FIG. 1A, filling the lined opening with an electrodeposited conductive layer, planarizing the surface and then depositing a cap layer over the planar surface. This step is widely known in the art as a "single copper damascene" process.

Once the liner/seed layer 16 conformally coats all sidewalls of opening 14, conductive metal (layer 18) is electroplated to over-fill the cavity followed by planarization to remove any excess conductive material and provide a planar surface of the structure. The preferred conductive metal is copper. A cap layer 20 may then be conformally provided over the entire planar surface to a thickness of about 100 A to about 5000 A. The cap layer 20 may include a material such as $Si_3N_4$ and the like. Accordingly, a single damascene metal level C1 (FIG. 7B), i.e., conductive layer 18, is formed on a substrate as shown in FIG. 1B.

Figure 1C:
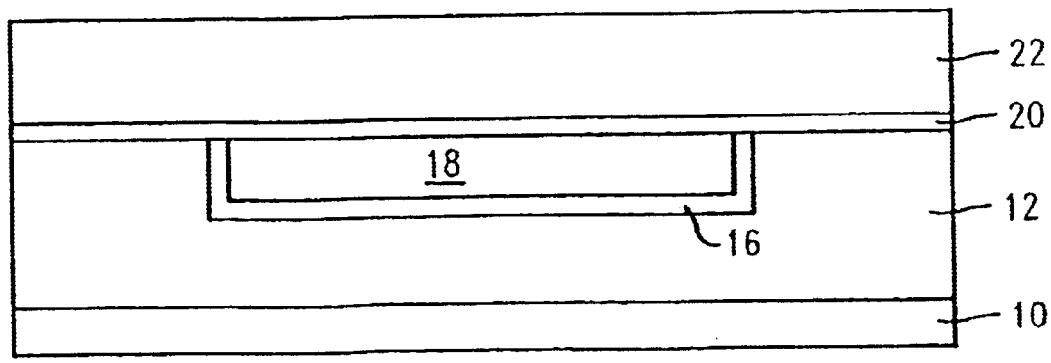
FIG. 1C illustrates a side view of the step of depositing a second inter-level dielectric layer over the structure of FIG. 1B.
Figure 2A:
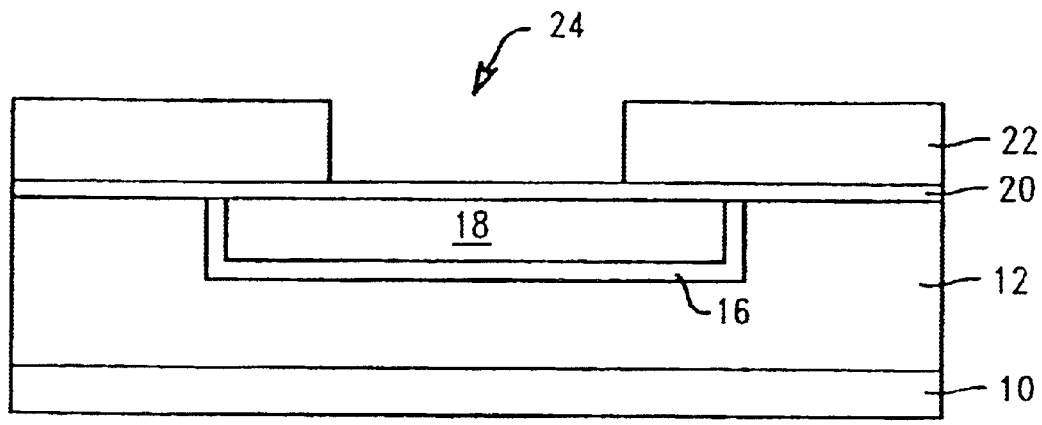
FIG. 2A illustrates a side view of the step of etching a first trench in the second inter-level dielectric layer.

As shown in FIG. 1C, once the cap layer 20 is formed, a second ILD layer 22 is then deposited over the entire structure by CVD to a thickness of about 0.1 μm to about 7 μm, preferably 4 μm. The second ILD layer 22 may include a material such as $SiO_2$, $Si_3N_4$, FSG, PSG, Low-k dielectrics like carbon doped oxides, SiLK and the like. A second trench 24 is then etched into the second ILD layer 22 (FIG. 2A) stopping at a top surface of the cap layer 20, thereby exposing a portion of cap layer 20. The trench is etched in that portion of the second ILD layer 22 directly over the conductive layer 18 such that the second trench 24 has x, y dimensions equal to or smaller than the x, y dimensions of the conductive layer 18, i.e., from about 3 μm to about 398 μm, preferably about 10 μm×48 μm. As such, the second trench 24 lies within the conductive metal area. This second trench 24 may be etched by known techniques including, for example, reactive ion etch using gases like $CHF_3$, $CF_4$ and the like. In accordance with the invention, this trench 24 is to be used as the cavity where a capacitor structure will be formed. Alternatively, the second trench 24 may be larger than the underlying metal layer 18. In case of microtrenching during trench etching, the presence of layer 12 below barrier layer 20 is a critical aspect for forming trench 24 to be smaller in dimensions than conductive layer 18, as shown in FIGS. 2A and 2B'.

Figure 2B:
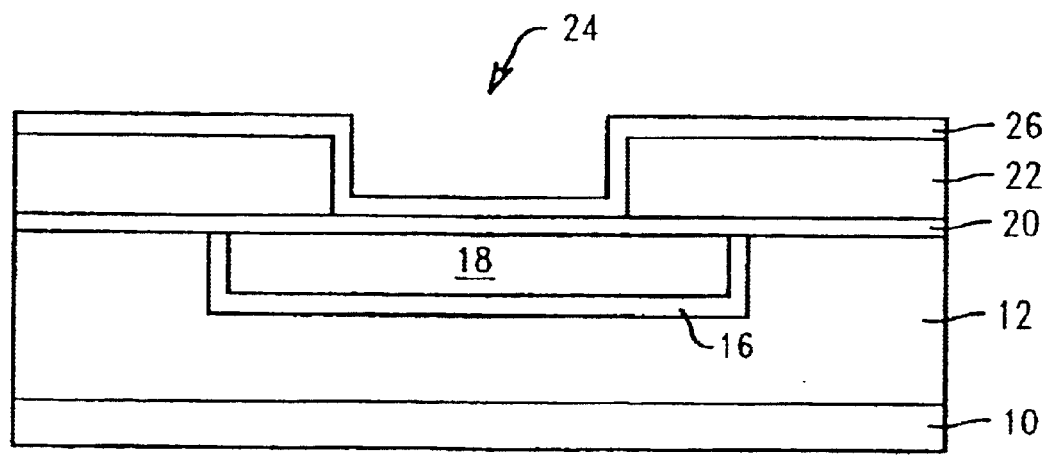
FIG. 2B illustrates a side view of depositing a barrier layer over the structure of FIG. 2A.
Figure 2B:
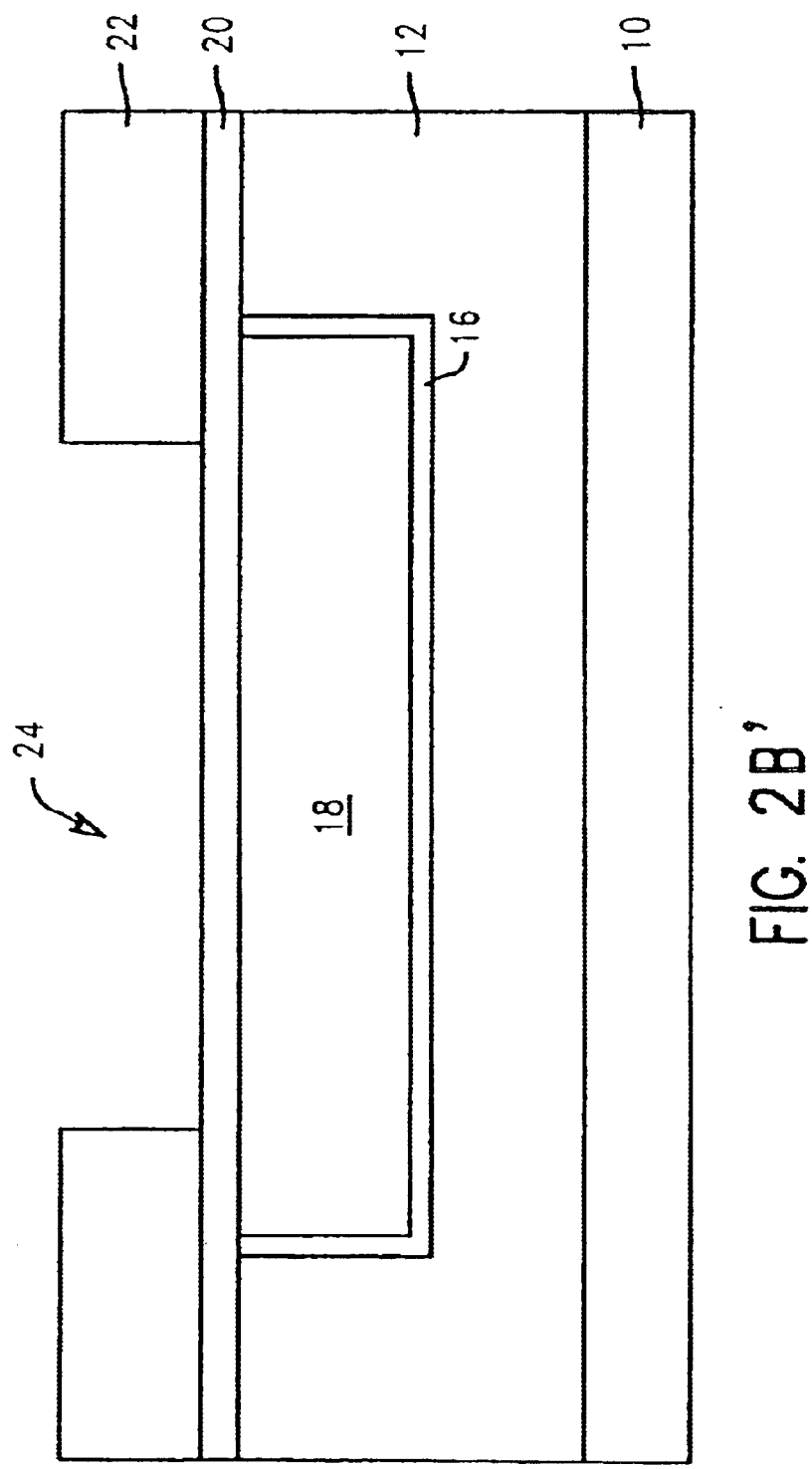

Once the trench 24 is formed in the second ILD layer, a barrier layer may optionally be deposited over the structure to conformally coat the entire surface of the structure as well as the sidewalls within the second trench, as shown in FIG. 2B. Alternatively, in a preferred embodiment, no barrier layer is deposited over the structure, as shown in FIG. 2B'. Wherein a barrier layer 26 is deposited over the structure, it is deposited directly over exposed portions of the cap layer 20, thereby directly contacting these exposed portions of cap layer. The barrier layer 26 may include materials such as $Si_3N_4$ and the like, deposited by known techniques, such as PECVD to a thickness ranging from about 100 A to about 5000 A. In accordance with the invention, the barrier layer 26 prevents diffusion of metals, such as, copper diffusion, in subsequent steps.

Figure 3A:
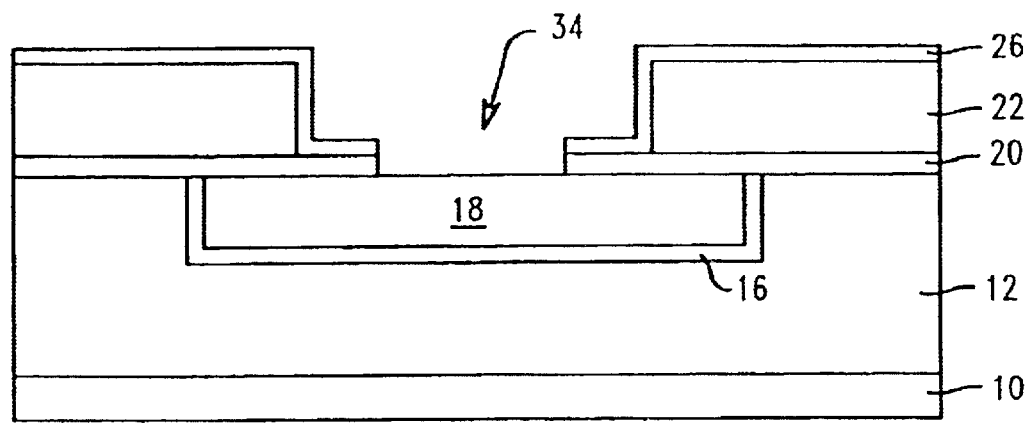
FIG. 3A illustrates a side view of the step of etching a window through the barrier and cap layers and stopping at the surface of the underlying conductive electrodeposited layer.

As shown in FIGS. 3A, 3A' and 3B, once the second trench 24 is formed, a window 34 is etched through the cap layer 20 to expose a portion of the conductive layer 18 where the pedestal structure for the capacitor of the invention will be formed. In so doing, a mask is formed at the bottom of the second trench 24, and then exposed portions of the cap layer 20 (FIG. 3A') are removed using an etchant that is selective only to the cap layer 20 and not the conductive layer 18. Alternatively, as shown in FIG. 3A, the mask is formed at the bottom of the second trench 24 whereby both the barrier layer 26 and then the cap layer 20 are etched. The etchants may include gases like $CHF_3$, $CF_4$ and the like. Window 34 is etched to x, y dimensions ranging from about 1 μm×10 μm to about 100 μm×300 μm, preferably of about 4 μm×40 μm.

Figure 3B:
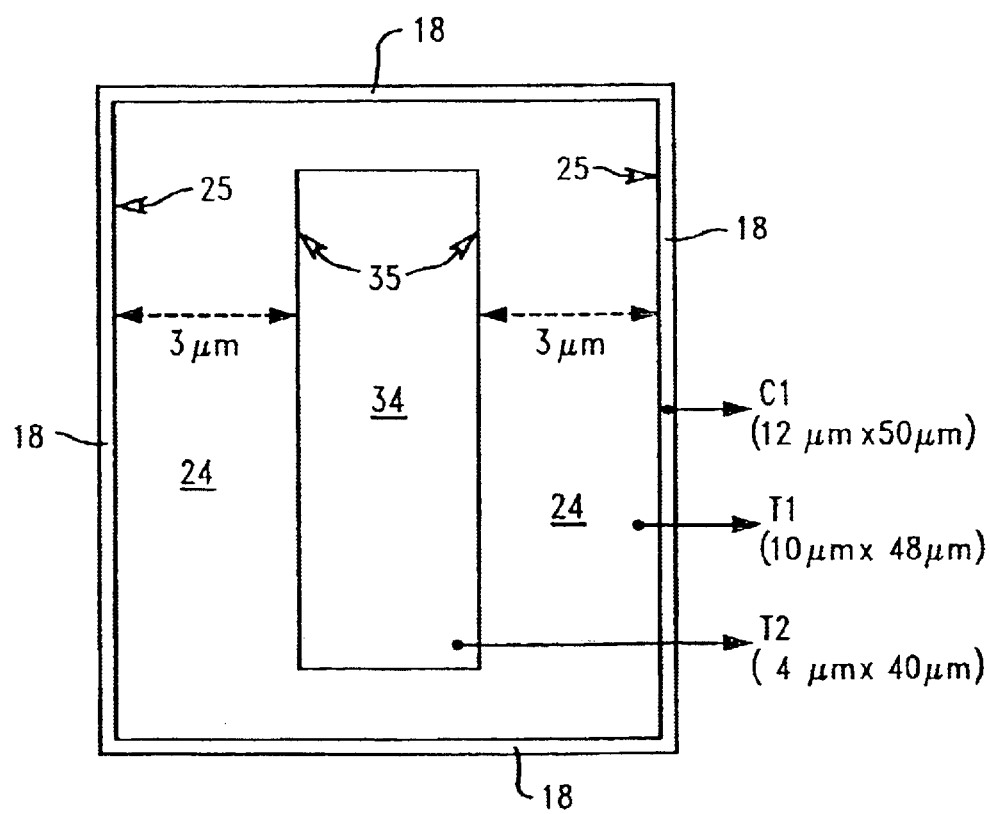
FIG. 3B illustrates a top plan view of the dimensions of a preferred embodiment of the structure formed in FIGS. 3A and 3A'.
Figure 3A:
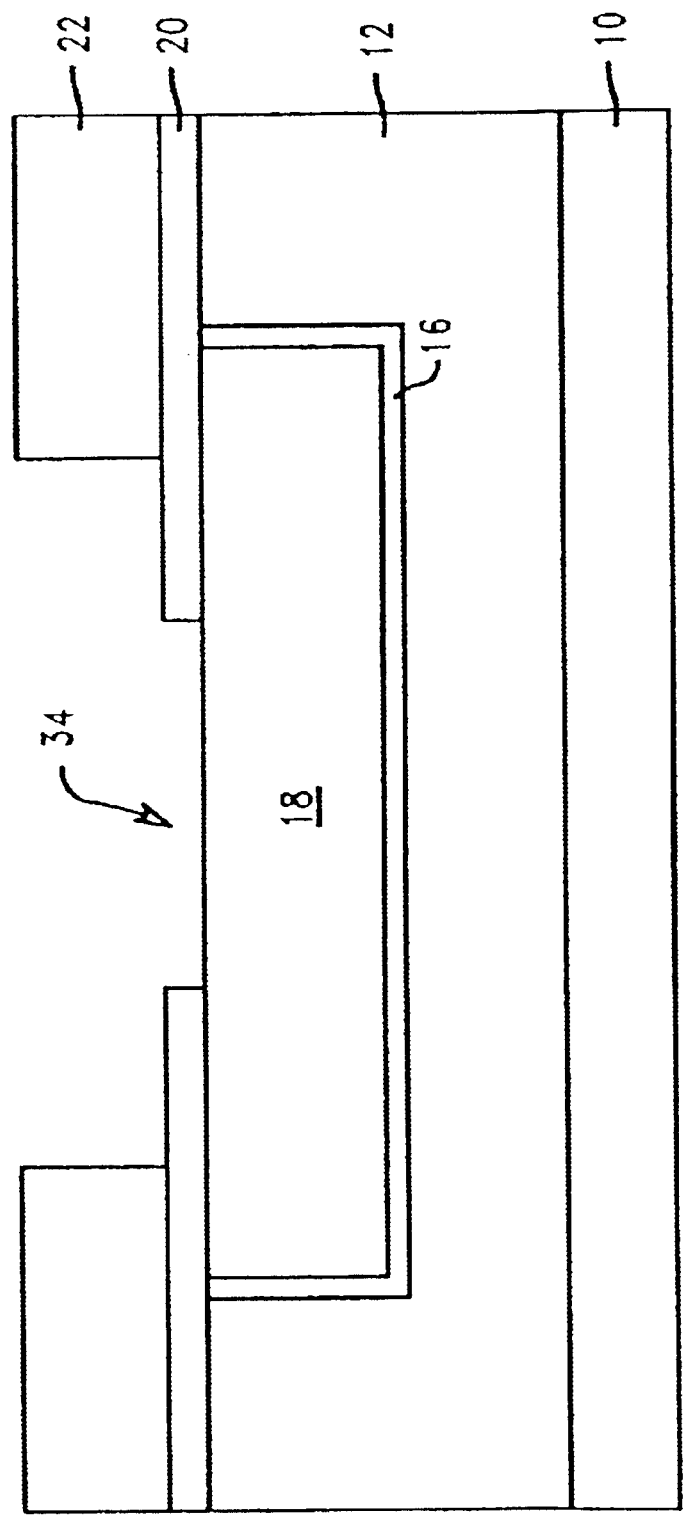

FIG. 3B illustrates a top plan view after the formation of the window 34 in FIGS. 3A and 3A'. As shown, window 34 has x, y dimensions smaller than the x, y dimensions of the second trench 24 so that the window 34 is entirely within the line area of the second trench. Likewise, the second trench 24 has x, y dimensions smaller than the x, y dimensions of the conductive line 18 so that second trench 24 is entirely within the line area of the conductive layer. For example, as shown in FIG. 3B, the conductive layer 18 (C1) has x, y dimensions of 12 μm×50 μm, the second trench 24 (T1) has x, y dimensions of 10 μm×48 μm and the window 34 (T2) has x, y dimensions of 4 μm×40 μm. As such, the side edges 35 of the second trench 34 are at least within 3 μm of the side edges 25 of the second trench 24. This distance from the trench edge can be varied to achieve multi-pedestal structures. In the case where trench 24 is larger than the conductive layer 18, the window 34 is entirely within the line area of the second trench.

Figure 4A:
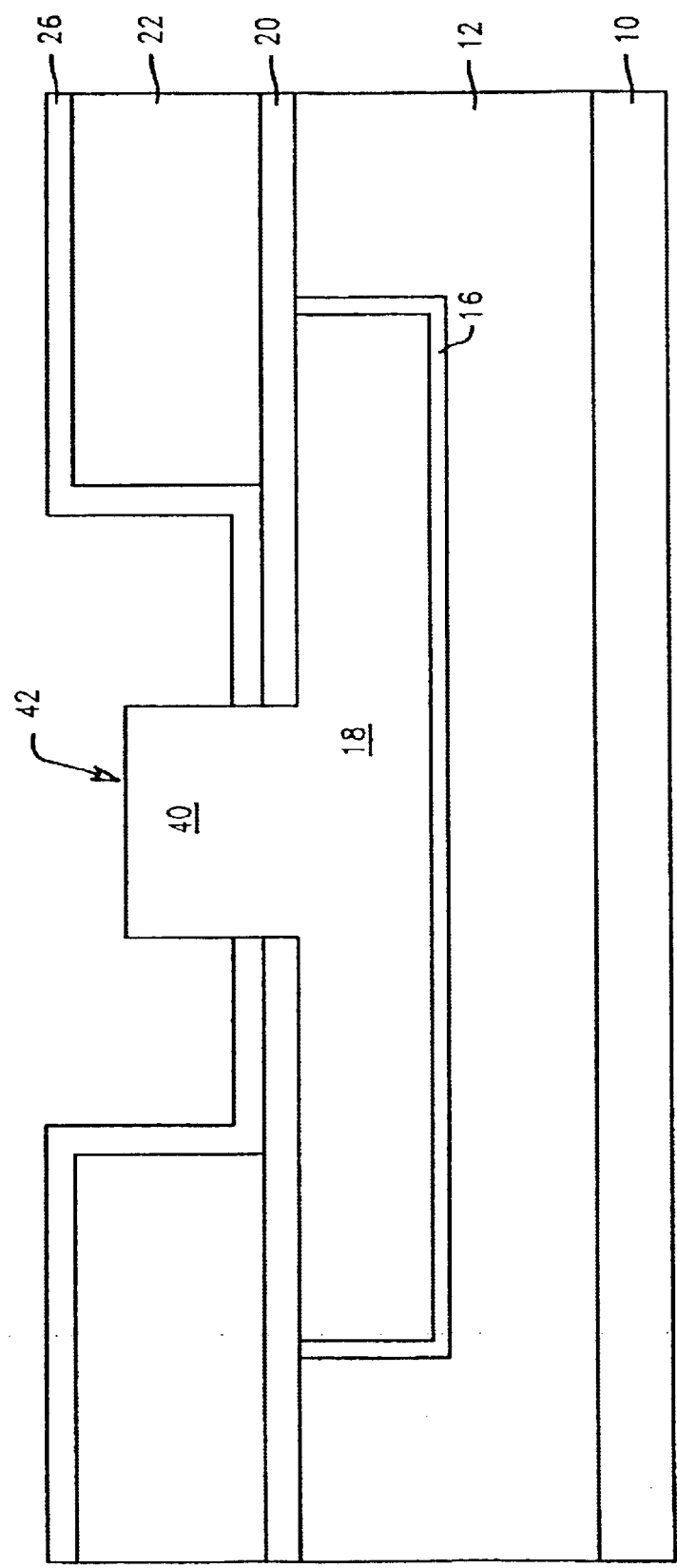
FIG. 4A illustrates a side view of electroless deposition of a conductive pedestal within the window of FIG. 3A only over those exposed portions of the underlying conductive layer, thereby forming a single, continuous conductive feature comprising the electrodeposited layer and the conductive electroless deposited pedestal that will be used to form a bottom electrode of the resultant capacitor.

Referring to FIGS. 4A and 4A', after window 34 is formed exposing an underlying portion of the conductive layer 18, a metal layer is deposited selectively over the exposed layer 18 so as to contact the conductive layer 18 and form a conductive pedestal 40 of the invention having a height ranging from about 0.1 μm to about 6 μm, preferably about 3 μm. This conductive pedestal 40 is a critical aspect of the invention as it is used to construct a capacitor with increased area. The metal layer may comprise the same material as the underlying conductive layer 18, or alternatively may comprise a different conductive material, such as, Ni—Au. The metal layer may be deposited by known selective deposition techniques. The conductive pedestal may also be created by electroplating or pattern plating (also known in the art as through-resist plating) of a conductive layer like copper. For example, copper may be directly deposited by known techniques of electroless plating only over the exposed conductive layer 18, which is also preferably copper, to form the conductive copper pedestal 40. In the embodiment wherein no barrier layer 26 is provided over the structure (FIG. 3A'), a blanket barrier etch process may be performed to remove exposed portions of the cap layer 20 after the conductive pedestal 40 is formed over the conductive layer 18. This blanket barrier etch process is selective to the conductive materials of the conductive pedestal 40 and conductive layer 18 so as to remove only the cap layer 20.

Figure 4A:
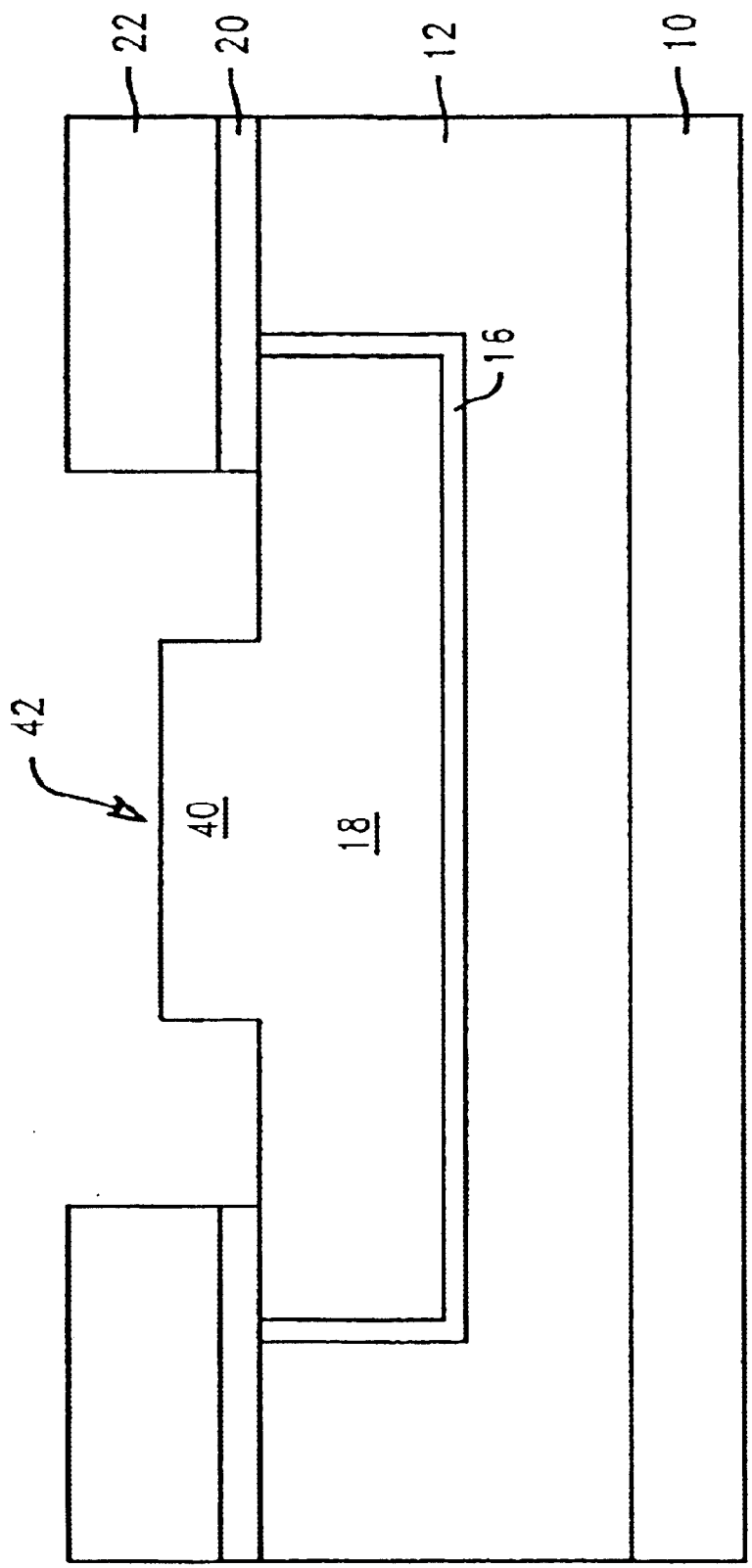

As such, the resultant structure shown in FIGS. 4 and 4' provides a single, continuous conductive feature 42 having the conductive pedestal 40 for formation of a capacitor whereby the single conductive feature 42 is formed by the combination of the conductive electroplated layer 18 and the conductive pedestal 40.

In accordance with the invention, a variety of different capacitors may then be constructed using the single conductive feature 42 (FIGS. 4A and 4A') whereby the conductive pedestal 40 is used as the bottom electrode of the resultant capacitor. The capacitors that may be constructed may include a single layer, a bilayer, or a trilayer or a plurality of layers of dielectric material within the metal-insulator-metal capacitors, and the like.

Figure 5A:
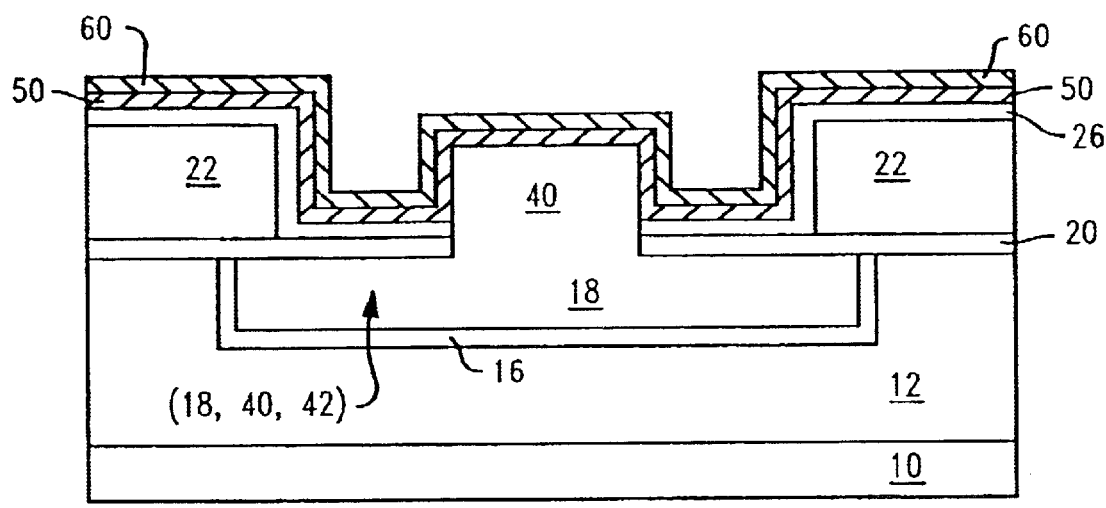
FIGS. 5A–F illustrate side views of the process steps of forming a metal-insulator-metal capacitor comprising single layer high-k dielectric material using the structure of FIG. 4A.

Referring to FIGS. 5A–F', process steps are shown for forming a capacitor comprising a single layer high-k dielectric material. Once the single, continuous conductive feature 42 is formed, a barrier layer 50 may be conformally deposited over the surface of the substrate followed by a precursor film 60 being conformally deposited over the barrier layer 50 (FIG. 5A). The barrier and precursor films may vary in thickness from about 50 A to about 5000 A. The barrier film prevents interfacial contact between the underlying conductive pedestal 40 of the continuous conductive feature 42 and the overlying precursor film 60. The barrier film 50 may include, but not be limited to, tungsten, molybdenum and the like, while the precursor film 60 may include, but not be limited to, tantalum nitride (TaN), tantalum, aluminum, antimony, bismuth, hafnium, niobium, titanium, tungsten, yttrium, zirconium and the like. Preferably the barrier film is tungsten and the precursor film is TaN.

Figure 5B:
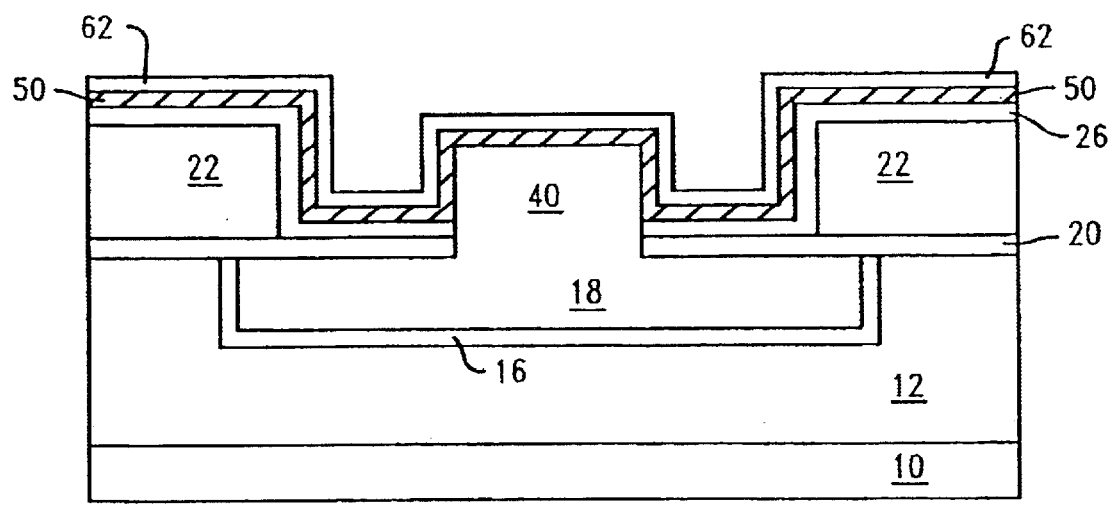
Figure 5C:
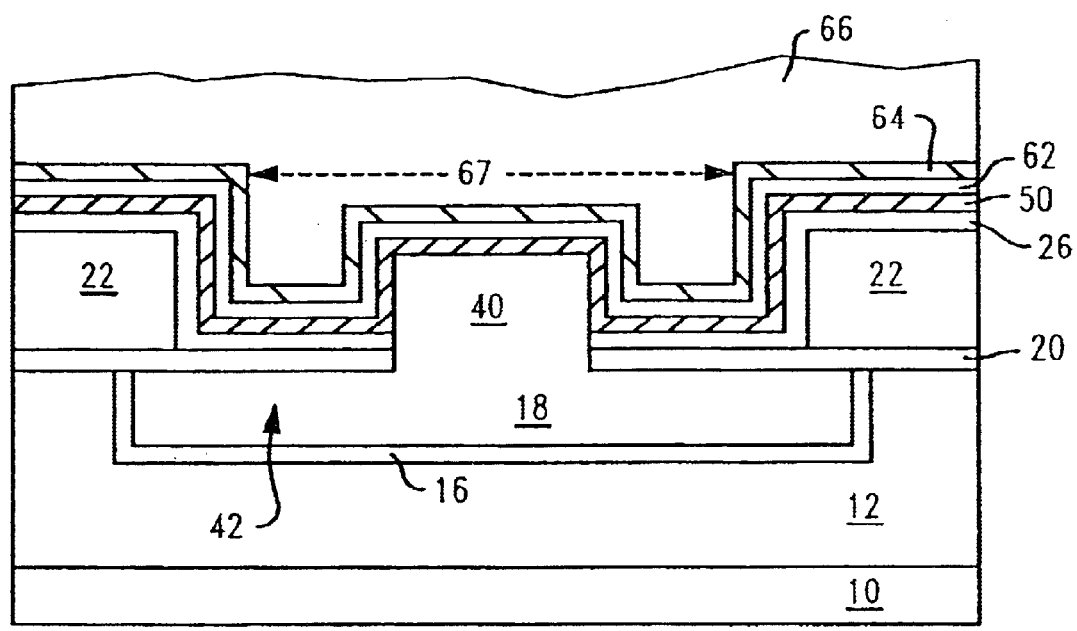

As shown in FIG. 5B, a capacitor having a high-k dielectric layer is then formed over the single conductive feature, preferably by anodization. This high-k dielectric layer is produced by the anodic oxidation of a precursor film that is separated from the underlying conductive pedestal by a barrier layer. The precursor film may include, but is not limited to, materials such as $TaN_x$, Ta, $TaSi_x$, Hf, Al, Sb, Bi, Hf, Nb, Ti, W, Y and Zr. Preferably, a TaN precursor film 60 is partially or completely oxidized based on correlations between anodization voltage and thickness of this TaN precursor film 60. In so doing, a high-k, low leakage dielectric film 62 is formed which preferably comprises a $Ta_2O_5$ film. Anodic oxides and/or high-k dielectric films produced in accordance with the embodiment of forming capacitors with high-k dielectric layers include, but are not limited to, $Nb_2O_5$, $Ta_2O_5$, $TiO_2$, $WO_3$, $Y_2O_3$, $ZrO_3$, and the like.

Figure 5D:
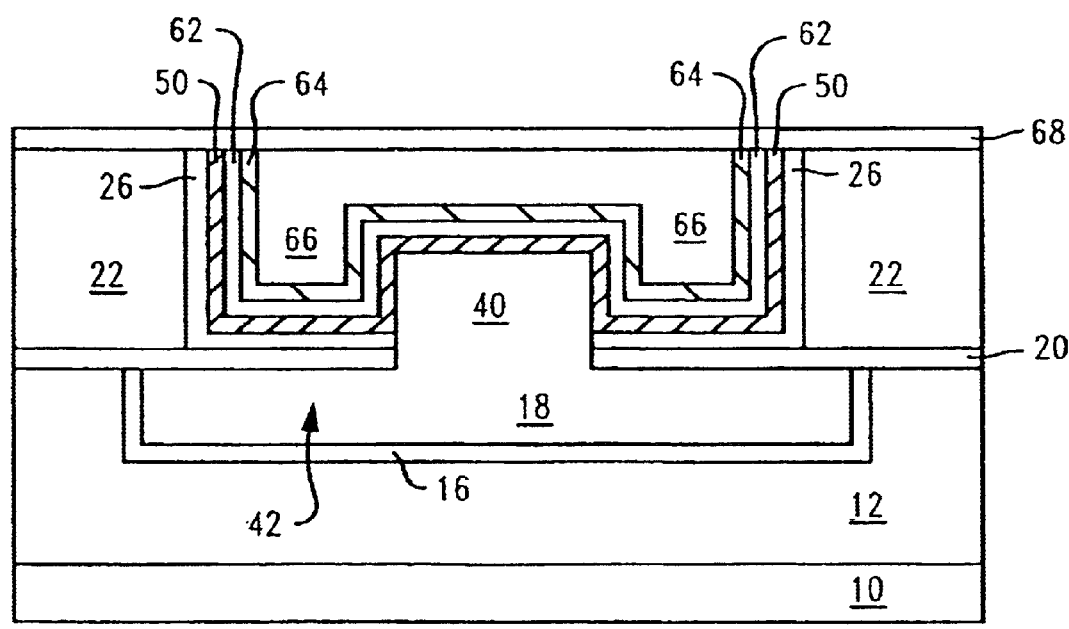
Figure 5E:
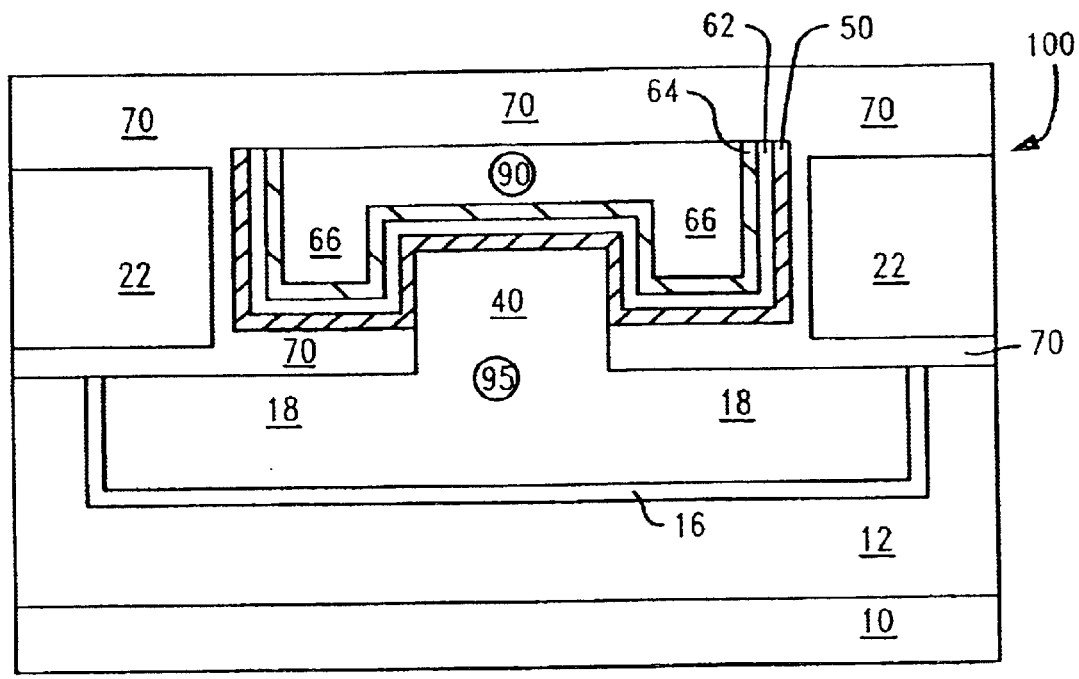
Figure 5F:
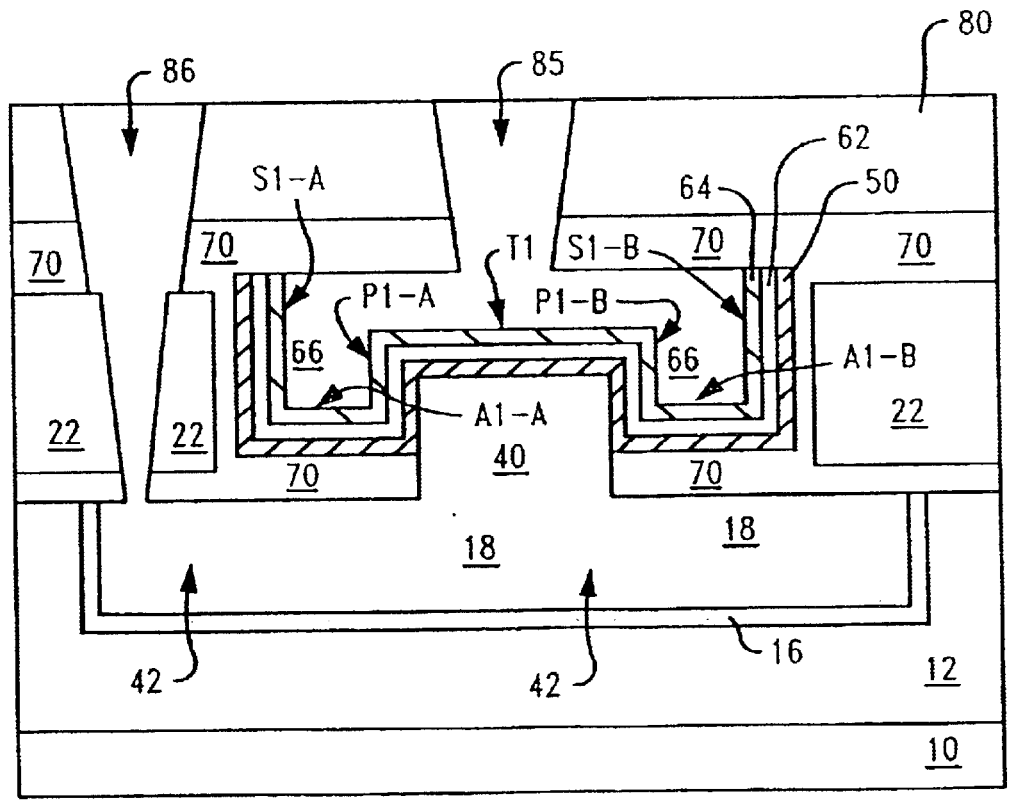
Figure 5F:
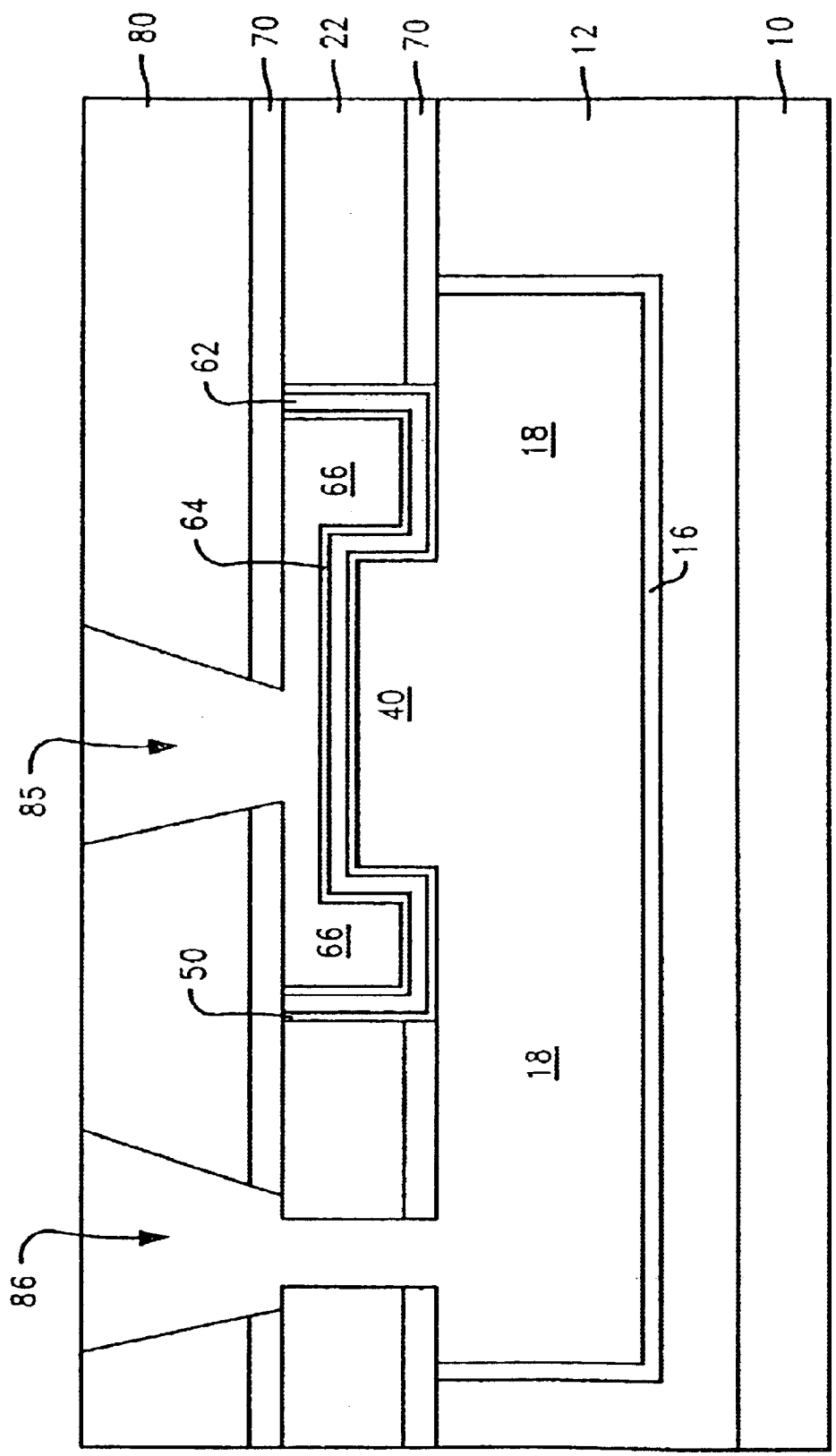
Figure 6A:
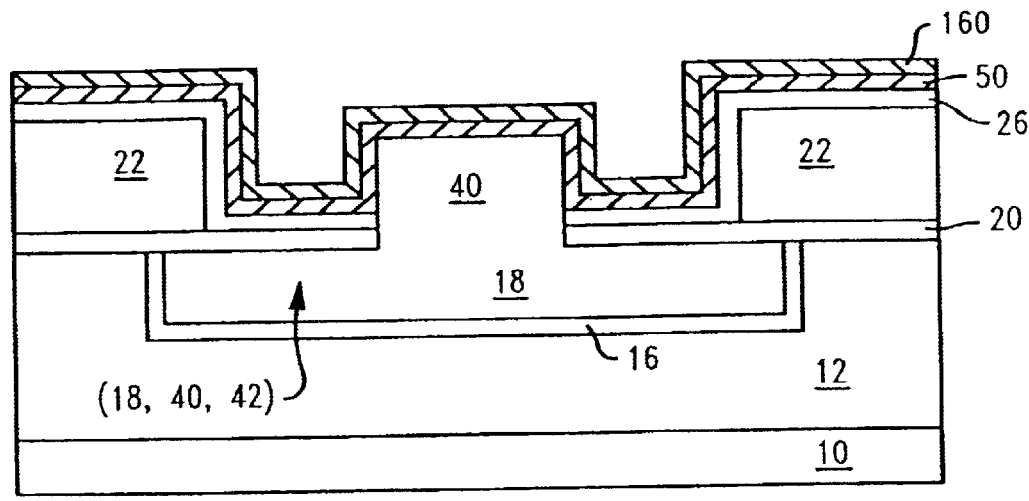
FIGS. 6A–F illustrate side views of the process steps of forming a metal-insulator-metal capacitor comprising a trilayer high-k dielectric material using the structure of FIG. 4A.

Rather than forming a single layer high-k dielectric material (FIGS. 5A–F'), a multilayer high-k dielectric metal-insulator-metal capacitor may be formed as shown in FIGS. 6A–F'. As shown in FIG. 6A, once the single, continuous conductive feature 42 is formed, the barrier layer 50 is conformally deposited over the surface of the substrate followed by another encapsulating film 160 (of comparable thickness as the barrier) being conformally deposited over the barrier layer. The barrier layer 50 and the encapsulating layer 160 prevent interfacial contact between the underlying conductive pedestal 40 of the continuous conductive feature 42 and the subsequent high-k dielectric deposition processes. Barrier layer 50 may include tungsten, TaN and the like, while the encapsulating film 160 may include TaN, titanium nitride (TiN) and the like. Preferably the barrier and encapsulating films are TaN.

Figure 6B:
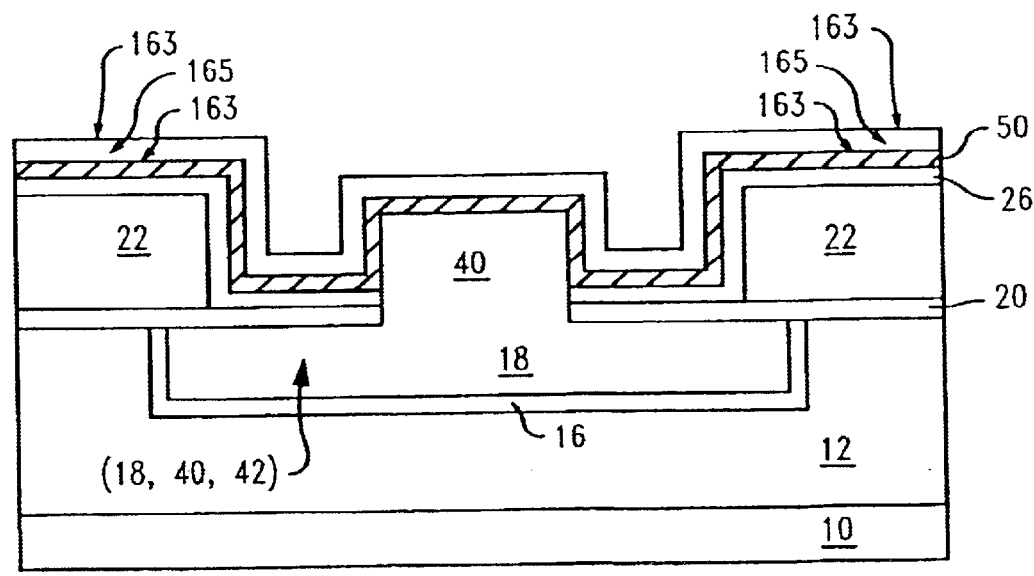
Figure 6C:
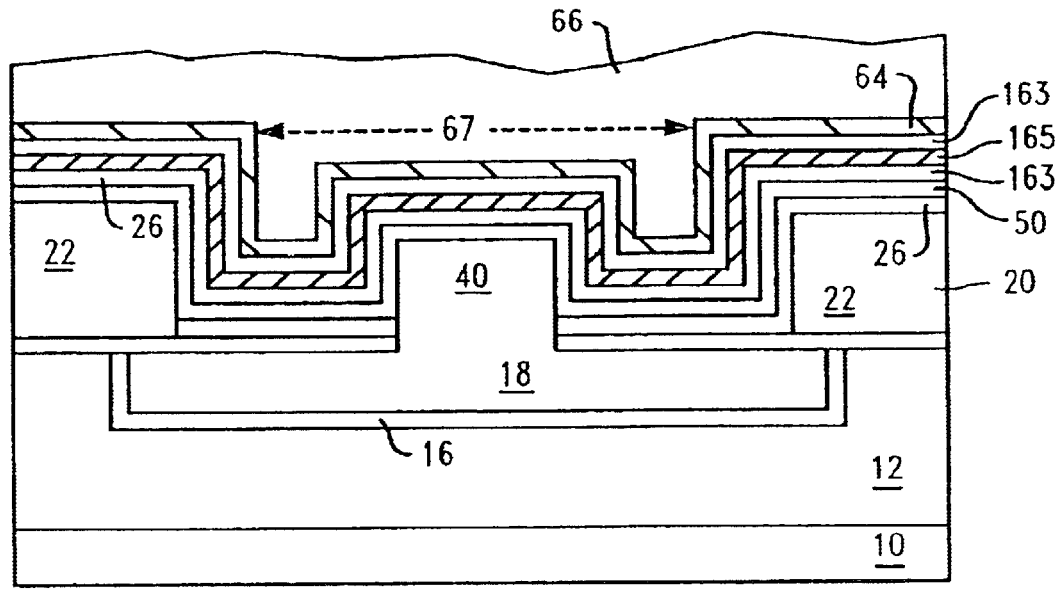

As shown in FIG. 6B, a multilayer or a single-layer high-k dielectric stack is then formed over the single conductive feature 42. The trilayer dielectric stack comprises a top low-leakage dielectric layer 163A directly over a middle high-k dielectric layer 165, which in turn, is directly over a bottom low-leakage dielectric layer 163. The low-leakage layers 163 and 163A may be formed by known deposition techniques including, but not limited to, for example, metalorganic chemical vapor deposition (MOCVD); plasma enhanced chemical vapor deposition (PECVD), and the like.

The preferred method of deposition for the low-leakage layers is atomic layer deposition (ALD). ALD is a wholly conformal process in which the reactants are supplied in pulses, separated from each other by a purge gas. Each reactant pulse chemically reacts with the wafer surface and this provides inherently better control to achieve precise monolayer growth. The low-leakage layers. 163 and 163A may comprise materials including $Al_2O_3$, $Si_3N_4$ and the like, while the high-k layer 165 may include $Ta_2O_5$, $Si_3N_4$, $SiO_2$, $HfO_2$ and the like. The middle layer 165 can be deposited by MOCVD, ALD and the like to provide a resultant trilevel stack comprising an $Al_2O_3$ layer 163A directly over a $Ta_2O_5$ layer 165, which in turn, is directly over another $Al_2O_3$ layer 163. The dielectric layers may vary in thickness based on capacitance requirements from about 10 A to about 1000 A. Alternate dielectric films that can be used include, but are not limited to, the bilayer stacks —$Si_3N_4/Ta_2O_5$, $Al_2O_3/Ta_2O_5$, $Al_2O_3/HfO_2$, $Si_3N_4/HfO_2$, $SiO_2/Ta_2O_5$, $SiO_2/HfO_2$ or single layer high-k dielectric layers such as $Al_2O_3$, $Ta_2O_5$, $HfO_2$, $SiO_2$, $Si_3N_4$ and the like.

After either the single anodized dielectric layer 62 of FIG. 5B, or the multi-component dielectric layers 163A, 165, 163 of FIG. 6B, are formed over the conductive feature 42 having pedestal 40, a barrier/seed layer 64 is then directly deposited over either the single dielectric or trilevel dielectric layers. The preferred barrier/seed layer 64 is tantalum, tantalum nitride and copper deposited by known techniques to a thickness ranging from about 50 A to about 5000 A.

Figure 6D:
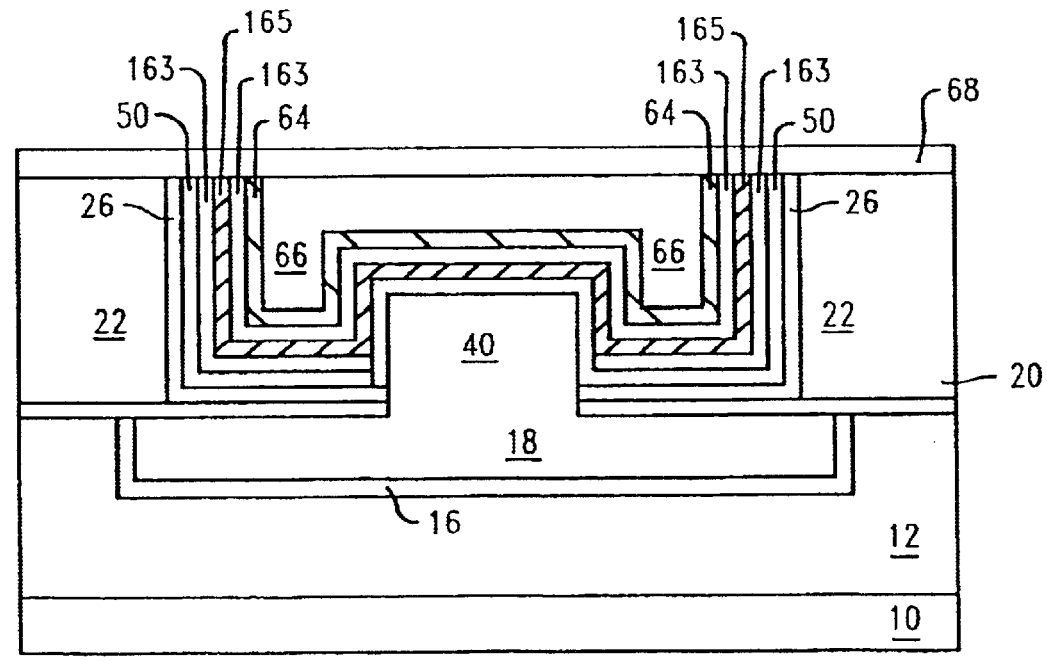
Figure 6E:
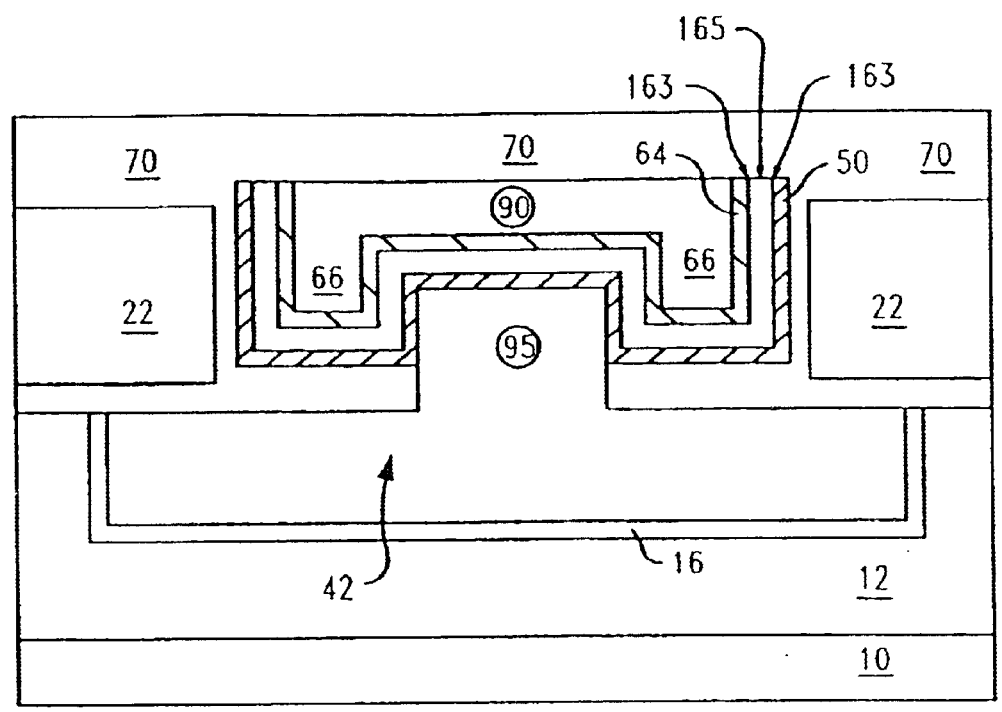

FIGS. 5C–F and 6C—F describe the top electrode fabrication process steps. As shown, a conductive metal layer 66, preferably copper, is then deposited by known electrodeposition techniques to a thickness that covers the Ta/TaN/Cu seed layer 64 and at least fills the exposed area directly over the single, continuous conductive feature 42 as denoted by reference numeral 67 in FIGS. 5C and 6C. This electroplated copper layer 66 will be used in subsequent steps to form a top electrode of the resultant capacitor. The electroplated copper layer 66 is then polished, such as by a chemical mechanical polishing technique, to planarize the surface of the structure. The chemical mechanical polishing proceeds with planarization by sequentially polishing the Ta/TaN/Cu seed layer 64 followed by polishing either the single $Ta_2O_5$ high-k dielectric film 62 of FIG. 5B, or alternatively, the trilevel low-leakage dielectric 163A, high-k dielectric 165, low-leakage dielectric 163 layers of FIG. 6B. The chemical mechanical polishing continues by polishing the barrier layer 50, 150, and stopping on the second ILD layer 22.

Wherein the structure contains the barrier layer 26 (FIGS. 4A and 5A–5F), the foregoing polishing step stops once the barrier polish-stop layer 26 has been reached. A second cap layer. 68 is then deposited over the planar surface of the structure to a thickness ranging from about 100 A to about 5000 A (FIGS. 5D and 6D). This second cap layer 68 preferably comprises the same material as the first cap layer 20; thereby resulting in a single continuous cap layer 70, as shown in FIGS. 5E and 6E, that electrically isolates a top electrode 90 of a resultant capacitor 100 from a bottom electrode 42 of the capacitor 100. Preferably, these first and second cap layers 20, 68 are silicon nitride layers.

Figure 6F:
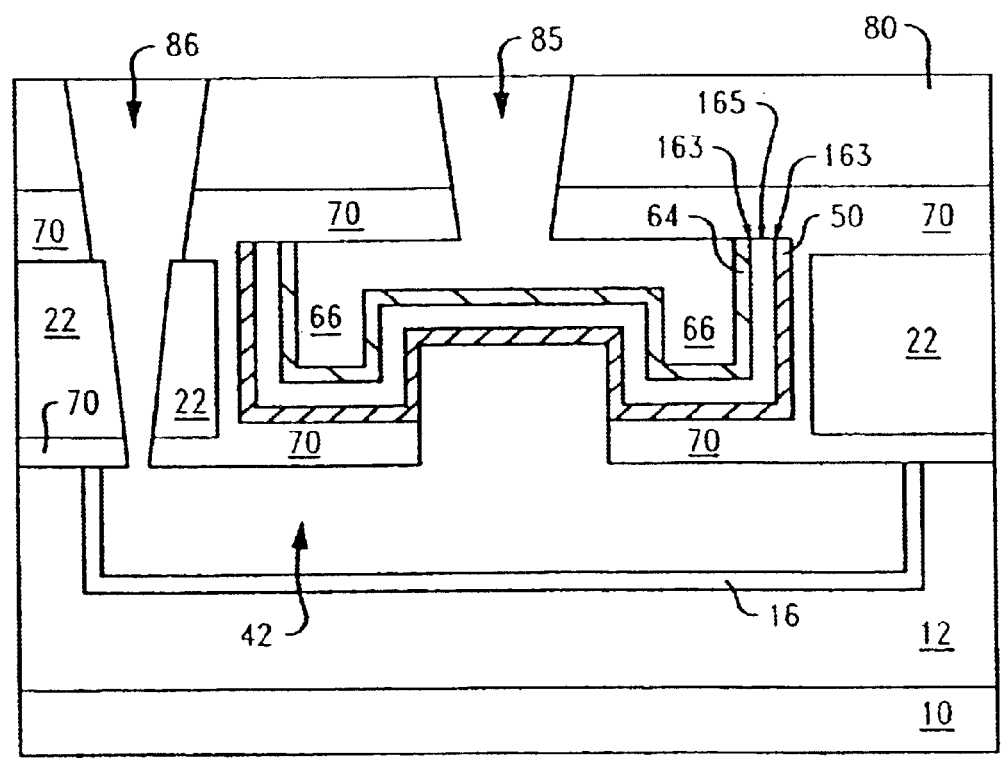
Figure 6F:
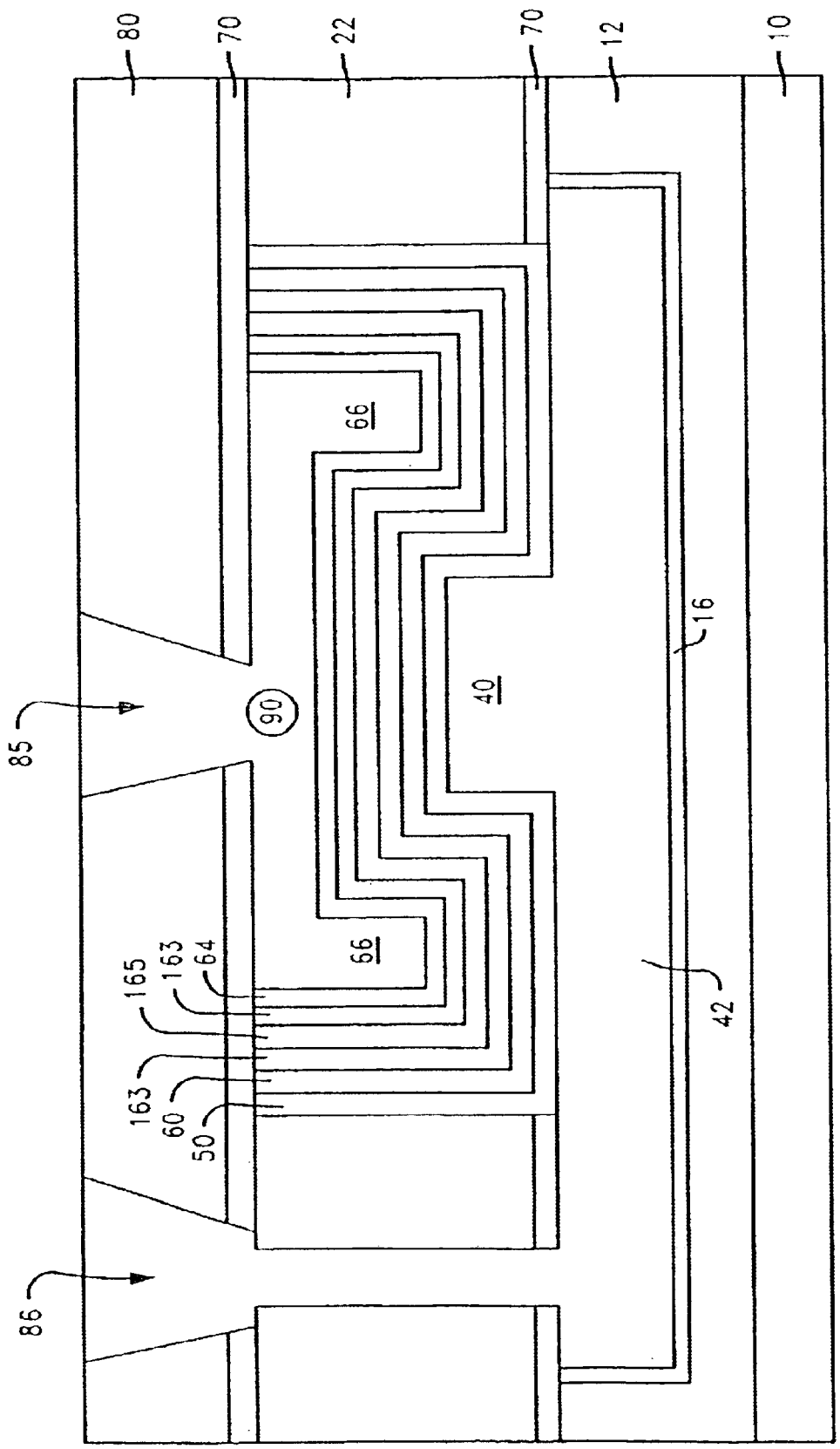

Referring to FIGS. 5F and 6F, an ILD layer 80 is provided over the continuous cap layer 70 and subsequently contacts 85, 86 are provided in the structure. The contacts may include, but not limited to, damascene copper or tungsten whereby a first contact 85 is in direct contact with the top electrode 90 and the second contact 86 is in direct contact with the bottom electrode 42. As illustrated in FIG. 5F, the resultant structure is a dual damascene via contact with a single high-k dielectric layer 62 (FIG. 5B), or alternatively, the resultant structure may be a dual damascene via contact with a trilevel low-leakage dielectric 163A, high-k dielectric 165, low-leakage dielectric 163 layers as shown in FIG. 6F.

FIG. 5F' illustrates a dual damascene via contact with a single high-k dielectric layer 62 made in accordance with the above description relating to FIGS. 5A–5F on the substrate as shown in FIG. 4' not having a barrier layer 26 provided over the structure (FIG. 3A'). Likewise, FIG. 6F' shows a dual damascene via contact with a trilevel low-leakage dielectric 163A, high-k dielectric 165, low-leakage dielectric 163 layers made in accordance with the above description relating to FIGS. 6A–6F on the substrate as shown in FIG. 4' not having a barrier layer 26 provided over the structure (FIG. 3A').

Accordingly, the instant invention advantageously provides a pedestal within a trench to increase the surface area within the trench and thereby increase the capacitance for building the resultant capacitor. For example, in the embodiment as shown in FIG. 5F', the total capacitance of the resultant capacitor is significantly increased, in comparison to an equivalent sized structure having no pedestal or cavity therein. This increased surface area of the structure may be easier understood in view of the table below relating to the single pedestal 40 structure of FIG. 5F' using the dimensions shown in FIG. 3B. As shown in the table, in this embodiment the combined x, y dimensions of the trench sidewalls and bottom and the pedestal 40 sidewalls and top surface provide a total surface area of 1208 $\mu m^2$ for building a capacitor. In comparison, in an equivalent sized, conventional capacitor, which has no pedestal and wherein only the trench bottom is typically used to build the capacitor, the x, y dimensions of the bottom of the trench (10 $\mu m \times 48$ $\mu m$ (T1)) (see, FIG. 3B) provide a surface area of 480 $\mu m^2$ for building a capacitor. Accordingly, the use of the instant single pedestal 40 within the trench increases the surface area capacitance for building a capacitor by at least 2.5 times. Additionally, in the embodiment as shown in FIG. 5F (having barrier layer 26), the presence of barrier layer above the electroplated conductive layer 18, reduces overall capacitance because of the presence of a layer with lower dielectric constant.

Single Pedestal Structure Area

| Trench Surface Area | Areal x, y Dimensions ($\mu m$) | Surface Area |
|---|---|---|
| Trench Sidewalls (S1) | 2((48 × 4) + (10 × 4)) | 464 $\mu m^2$ |
| Pedestal Sidewalls (P1) | 2((40 × 3) + (4 × 3)) | 264 $\mu m^2$ |
| Pedestal Top Surface (T1) | (4 × 40) | 160 $\mu m^2$ |
| Trench Bottom Wall (A1) | 2(3 × 48) + 2(4 × 4) | 320 $\mu m^2$ |
| TOTAL | | 1208 $\mu m^2$ |

Figure 7A:
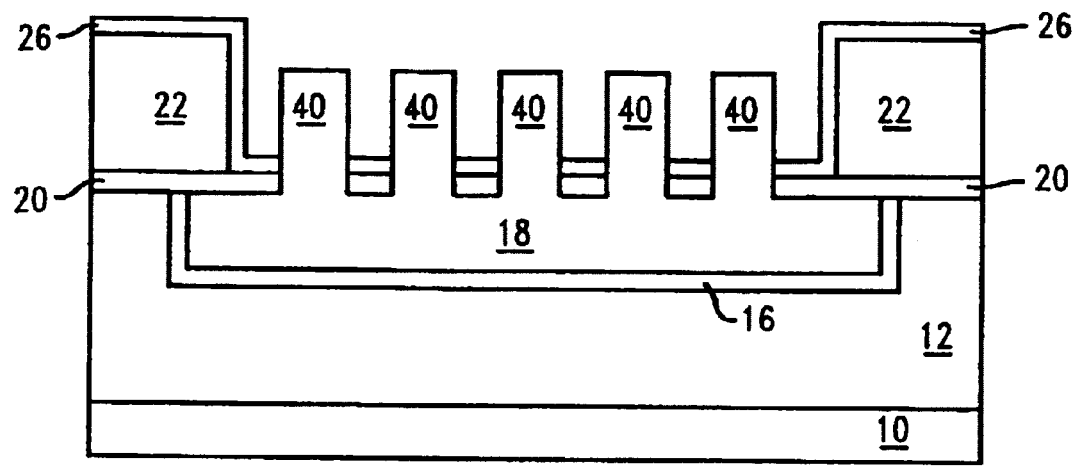
FIGS. 7A and 7A' illustrate a side view of an alternate embodiment of the invention having a plurality of conductive pedestals, such as five (5) conductive pedestals, formed within a trench in accordance with the process steps as illustrated in FIGS. 1A through 4A' to form a single, continuous conductive feature having a plurality of conductive pedestals.
Figure 7B:
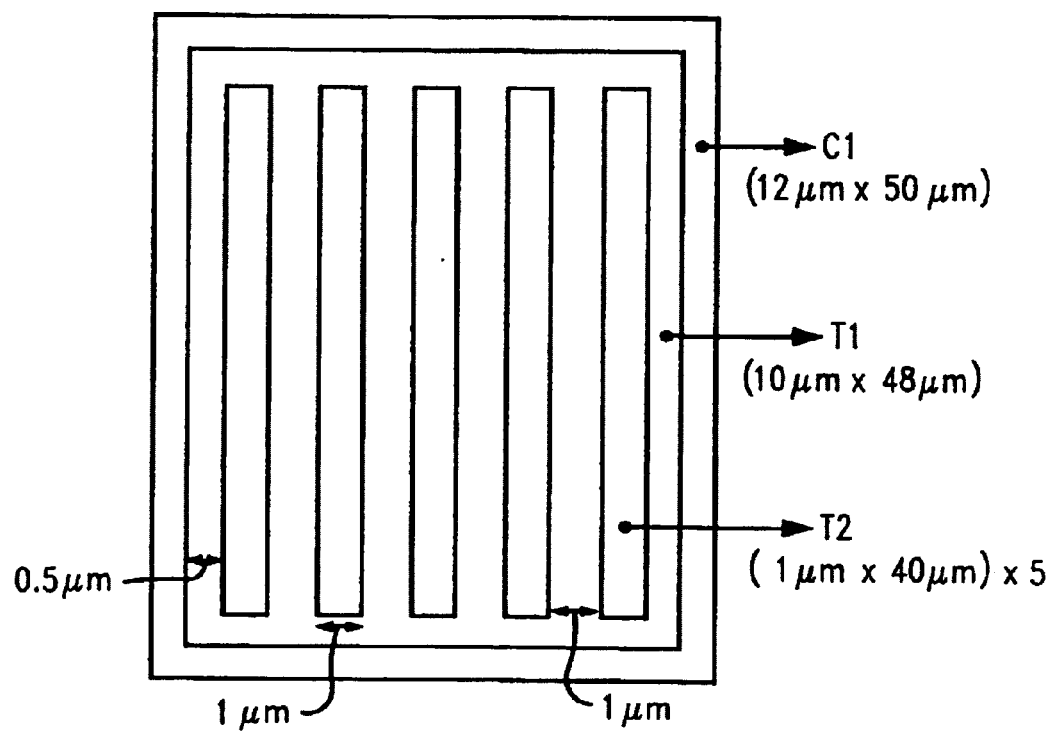
FIG. 7B illustrates a top plan view of the dimensions of the structure in FIGS. 7A and 7A'
Figure 7A:
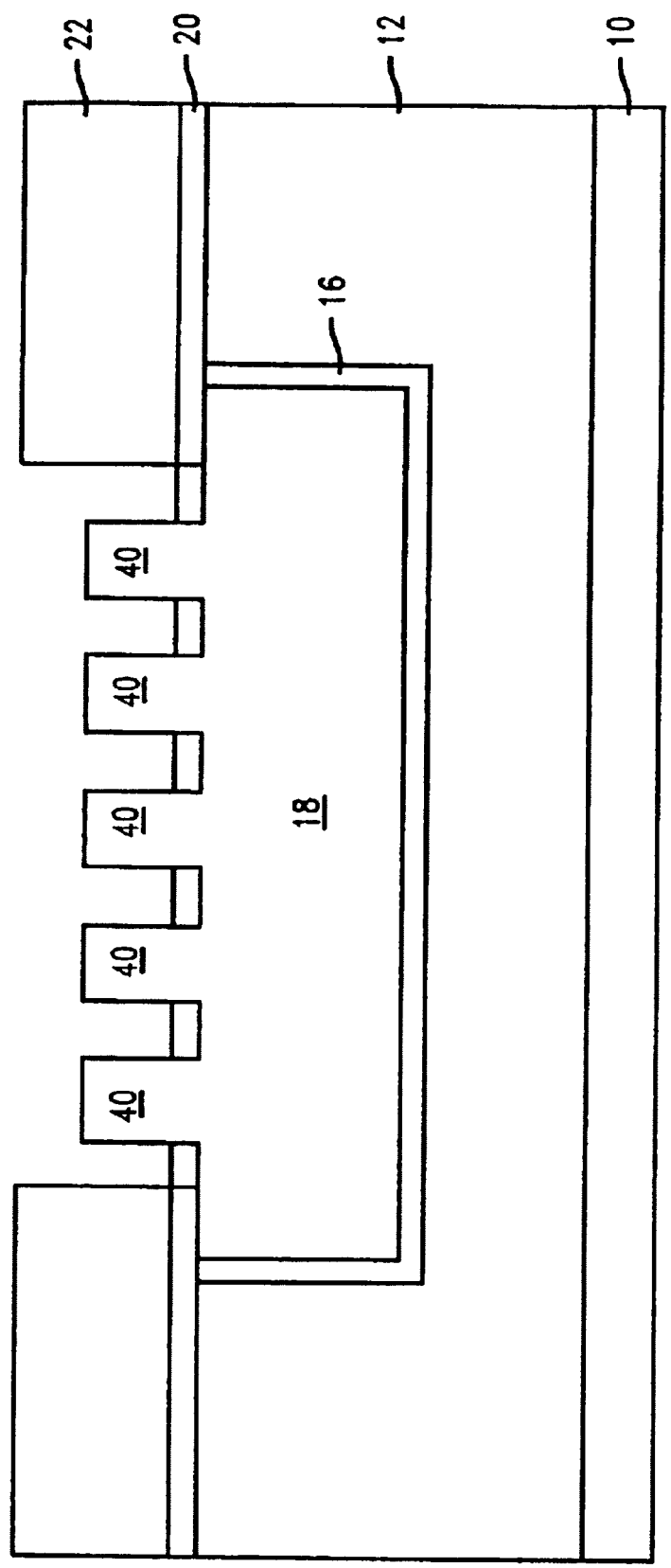
Figure 7C:
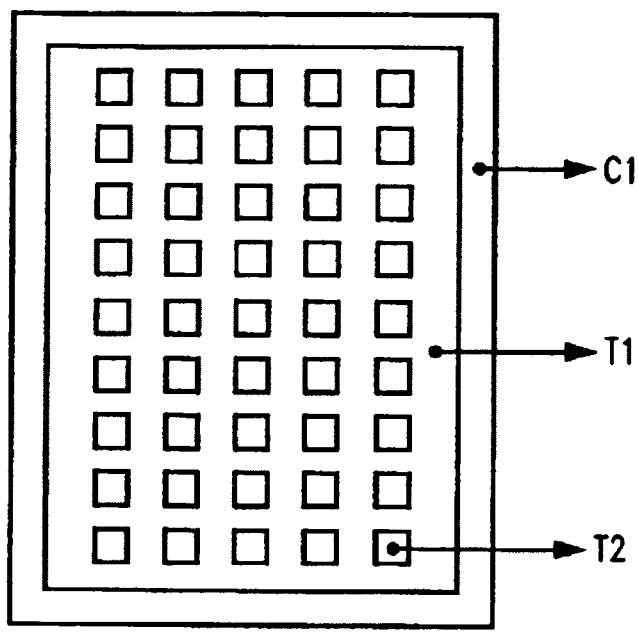
FIGS. 7C–D illustrate top plan views of still further embodiments of the invention having a plurality of conductive pedestals.
Figure 7D:
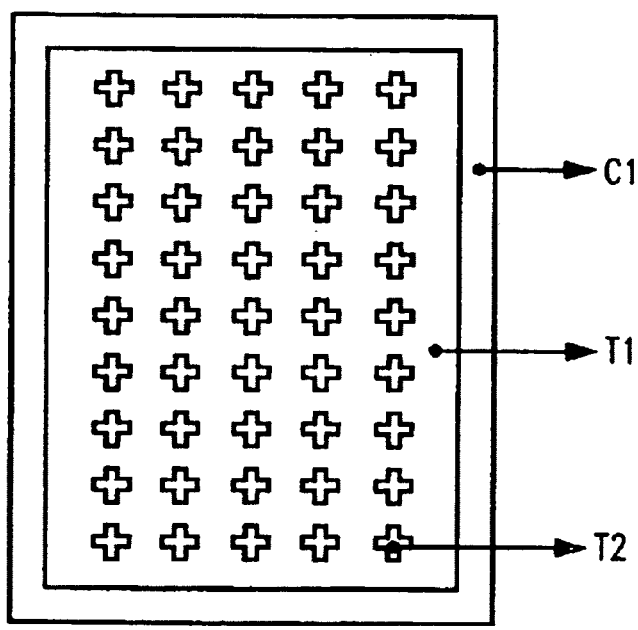

Referring to FIGS. 7A, A'-D, in another aspect of the invention, a plurality of conductive pedestals 40 may be created within a plurality of trenches 34 (T2) thereby still further increasing the surface area for building a capacitor. This plurality of conductive pedestals 40 may have a variety of shapes and sizes as illustrated in the top plan views of FIGS. 7B–D.

For example, as shown in FIGS. 7A, A' and B, five (5) pedestals 40 may be created in five (5) windows (T2). The results of the increased surface area are displayed in the table below. The combined x, y dimensions of the trench sidewalls and bottom and the five pedestal 40 sidewalls and top surface provide a total surface area of 2174 $\mu m^2$ for building a capacitor. As above, the equivalent sized, conventional capacitor has x, y dimensions of the trench bottom of 10 $\mu m \times 48$ $\mu m$ (T1) to provide a surface area of 480 $\mu m^2$ for building a capacitor. Thus, the use of five pedestals 40 within the trench (T1) increases the surface area 4.5 times in comparison to conventional lateral capacitors of equivalent size. Accordingly, wherein a plurality of pedestals 40 are created in a trench, the surface area of the resultant capacitor is dramatically increased to provide significantly higher capacitance. Further, the presence of the barrier layer above the electroplated conductive layer 18 significantly reduces overall capacitance because of the presence of a layer with lower dielectric constant.

Five (5) Pedestal Structure Surface Area

| Trench Surface Area | Areal x, y Dimensions ($\mu m$) | Surface Area |
|---|---|---|
| Trench Sidewalls (S1) | 2((48 × 4) + (10 × 4)) | 464 $\mu m^2$ |
| Pedestal Sidewalls (P1) | 5[2((40 × 3) + (1 × 3))] | 1230 $\mu m^2$ |
| Pedestal Top Surface (T1) | 5(1 × 40) | 200 $\mu m^2$ |
| Trench Bottom Wall (A1) | 4(1 × 48) + 2(0.5 × 48) + 2(4 × 1 × 5) | 280 $\mu m^2$ |
| TOTAL | | 2174 $\mu m^2$ |

Accordingly, the instant invention creates high-k dielectric capacitors with metal electrodes. In accordance with the invention, it has unexpectedly been discovered that by providing at least one pedestal within a trench, many novel structures with increased surface area may be achieved having significantly higher capacitance. The novel use of multi-component high-k dielectric films (described above) significantly improves electrical performance (low leakage current and high breakdown voltage) and yields high capacitance. The use of atomic layer deposition provides conformal high-k dielectric thin films that can produce devices with high capacitance densities from 5–20 fF/$\mu m^2$. The geometry of the structure prevents shorting between top and bottom electrodes of the capacitor. The damascene processing of copper electrodes enable high quality factors, low series resistance and improved electromigration resistance.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A capacitor comprising:
   a first inter-level dielectric on a substrate;
   a first trench in said first inter-level dielectric;
   a first conductive material within said first trench;
   a second inter-level dielectric residing over said first inter-level dielectric and a portion of said conductive material;
   a second trench in said second inter-level dielectric, said second trench residing over and exposing a portion of said first conductive material;
   a second conductive material within said second trench to provide a conductive pedestal directly over said exposed portion of said first conductive material, said conductive pedestal increasing surface area of said capacitor thereby enabling said capacitor to have a significantly higher capacitance, said first conductive material and said conductive pedestal together forming a continuous conductive feature; and
   a first electrode of said capacitor comprising said continuous conductive feature.

2. The capacitor of claim 1 further including a cap layer residing between said first and second inter-level dielectric layers.

3. The capacitor of claim 2 further including:
a first barrier layer over exposed portions of said conductive pedestal and an area over said continuous conductive feature;
at least one high-k dielectric layer over said barrier layer;
a second barrier layer over said at least one high-k dielectric layer;
a conductive metal layer over said second barrier layer and filling said area; and
a second cap layer over a portion of said conductive metal layer and continuous with said first cap layer to isolate said conductive metal layer together forming a second electrode of said capacitor from said first electrode of said capacitor comprising continuous conductive feature.

4. The capacitor of claim 1 wherein said first and second conductive materials comprise the same conductive material.

5. The capacitor of claim 1 wherein said first and second conductive materials comprise different conductive materials.

6. The capacitor of claim 5 further including a barrier layer lining sidewalls of said first trench and said second trench.

7. The capacitor of claim 1 wherein said at least one high-k dielectric layer comprises a single-layer high-k dielectric.

8. The capacitor of claim 1 wherein said at least one high-k dielectric layer comprises a multi-layer high-k dielectric layer.

9. The capacitor of claim 8 wherein said at least one multi-layer high-k dielectric layer comprises a top low-leakage dielectric layer, a middle high-k dielectric layer and a bottom low-leakage dielectric layer.

10. The capacitor of claim 1 wherein said at least one high-k dielectric layer is selected from the group consisting of $Nb_2O_5$, $TiO_2$, $WO_3$, $Y_2O_3$, $ZrO_3$, $Al_2O_3$, $Si_3N_4$, $Ta_2O_5$, $SiO_2$, $HfO_2$, and combinations thereof.

11. The capacitor of claim 1 wherein said capacitor comprises a plurality of conductive pedestals having a variety of shapes and sizes to further maximize surface area of said capacitor.

12. A capacitor comprising:
a first inter-level dielectric on a substrate having a first trench filled with a first conductive material;
a second inter-level dielectric over said first inter-level dielectric having a second trench over and smaller in dimension than said first trench filled with a second conductive material to provide a conductive pedestal directly over said first conductive material to provide a continuous conductive feature;
a first barrier layer lining an area over said continuous conductive feature and covering exposed portions of said conductive pedestal within said area;
at least one high-k dielectric layer over said barrier layer;
a second barrier layer over said at least one high-k dielectric layer;
a conductive metal layer over said second barrier layer and filling said area; and
a continuous cap layer residing between said first and second inter-level dielectric layers and over a portion of said conductive metal layer to isolate said conductive metal layer;
a top electrode of said capacitor comprising said conductive metal layer; and
a bottom electrode of said capacitor comprising said continuous conductive feature, whereby said conductive pedestal of said continuous conductive feature increases surface area of said capacitor thereby enabling said capacitor to have a significantly higher capacitance.

13. The capacitor of claim 12 wherein said conductive pedestal of said bottom electrode increases surface area of the capacitor to increase said capacitance as a function of:

$$C=\epsilon_0\epsilon_r d/A,$$

whereby said capacitance "C" is equal to permitivity of the free space "$\epsilon_0=8.85.\times.10^{-14}$ F/cm" multiplied by relative permitivity "$\epsilon_r$" multiplied by thickness of said at least one high-k dielectric layer divided by surface area of said substrate "A".

14. The capacitor of claim 13 wherein said capacitor further comprises a plurality of conductive pedestals having a variety of shapes and sizes to further increase surface area of said capacitor.

* * * * *